(12) United States Patent
Flanders et al.

(10) Patent No.: US 6,534,225 B2
(45) Date of Patent: Mar. 18, 2003

(54) TAPERED ION IMPLANTATION WITH FEMTOSECOND LASER ABLATION TO REMOVE PRINTABLE ALTERNATING PHASE SHIFT FEATURES

(75) Inventors: Steven D. Flanders, Colchester, VT (US); Dennis M. Hayden, Essex Junction, VT (US); Timothy E. Neary, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/892,957

(22) Filed: Jun. 27, 2001

(65) Prior Publication Data

US 2003/0003371 A1 Jan. 2, 2003

(51) Int. Cl.⁷ .............................. G03F 9/00; C03C 15/00
(52) U.S. Cl. ............................................. 430/5; 216/46
(58) Field of Search ........................... 430/5, 322, 323, 430/324, 330; 204/192.1; 216/46, 47

(56) References Cited

U.S. PATENT DOCUMENTS

| | | | |
|---|---|---|---|
| 5,487,962 A | 1/1996 | Rolfson | 430/5 |
| 5,538,833 A | 7/1996 | Ferguson et al. | 430/325 |
| 5,672,450 A | 9/1997 | Rolfson | 430/5 |
| 5,759,724 A | 6/1998 | Rolson | 430/5 |
| 5,840,447 A | 11/1998 | Peng | 430/5 |
| 5,869,212 A | 2/1999 | Hashimoto | 430/5 |
| 5,882,534 A | 3/1999 | Song | 216/12 |
| 5,902,701 A | 5/1999 | Bae | 430/5 |
| 5,972,540 A | 10/1999 | Lee | 430/5 |
| 5,972,543 A | 10/1999 | Yokoyama et al. | 430/5 |
| 5,976,733 A | 11/1999 | Hashimoto | 430/5 |
| 5,994,001 A | 11/1999 | Nakao | 430/5 |
| 6,365,325 B1 * | 4/2002 | Chiang et al. | 430/313 |
| 6,410,191 B1 * | 6/2002 | Nistler et al. | 430/5 |

* cited by examiner

Primary Examiner—S. Rosasco
(74) Attorney, Agent, or Firm—Scully, Scott, Murphy & Presser; Richard M. Kotulak

(57) ABSTRACT

The present invention provides various methods for eliminating printable alternating phase shift defects from an alternating phase shift mask without the need of using a trim mask. Specifically, unwanted printable defects are removed by employing methods which provide a gradual sloped region in the transparent or semi-transparent substrate which is formed in an area of the substrate opposite to that of the opaque image which is formed thereon.

49 Claims, 6 Drawing Sheets

TAPERED ION IMPLANTATION WITH FEMTOSECOND LASER ABLATION TO REMOVE PRINTABLE ALTERNATING PHASE SHIFT FEATURES

FIELD OF THE INVENTION

The present invention relates to optical lithography, and more particularly to various methods of fabricating alternating phase shift masks that can be used to pattern various semiconducting devices via an optical lithographic process.

BACKGROUND OF THE INVENTION

Phase shifting technology is one of the more useful methods available to enhance the performance of optical lithography. A phase shifting mask normally consists of an absorbing phase shifting material having from about 5 to about 20% transmittance and a transparent or semi-transparent substrate such as quartz.

Currently, the process of creating typical alternating phase shift masks intentionally creates a step feature of up to about 3000 Å in the transparent or semi-transparent substrate. Such a prior art process is shown, for example, in FIGS. 1A–1D. Specifically, FIG. 1A shows an initial structure that is typically employed in the prior art in fabricating an alternating phase shift mask. The initial structure shown in FIG. 1A comprises transparent or semi-transparent substrate 10, phase shift material 12 that is formed on a portion of substrate 10, and a patterned resist 14 which is formed atop a portion of phase shift material 12 as well as portion of substrate 10. The initial structure shown is fabricated utilizing conventional processes well known in the art; therefore a detailed discussion concerning the same is not needed herein.

Next, and as shown in FIG. 1B, the initial structure is then subjected to a conventional dry etching process such as reactive-ion etching (RIE) which is capable of selectively removing the exposed portions of substrate 10. The resultant structure shown in FIG. 1B is then subjected to a conventional etch back process which results in the formation of the structure shown, for example, in FIG. 1C. The patterned resist is then removed utilizing a conventional stripping process so as to provide the mask shown in FIG. 1D. Due to the processing steps described above, step region 16 is formed in a portion of the substrate which is opposite to that of phase shift material 12. Step region 16 is undesirable since it results in a printable defect region in the mask.

There is an artifact of the prior art etching process that creates this step region where a phase shift is not required. The "extra" step in the substrate will create printable lines in the semiconductor wafers due to the effects of the phase shift of light and the sensitivity of the resist on the semiconductor wafer.

One solution to the above problem for the device lines is to create a second mask that can be exposed on the same wafer to eliminate this region of printable lines. This type of mask is known in the art as a "trim" mask. Although capable of removing the unwanted printable lines caused by the steps in the substrate, the use of trim masks requires a two-step process in the device lines for every wafer.

In view of the above problem with fabricating prior art phase shift masks, there is a continued need for developing a new and improved method of fabricating alternating phase shift masks that eliminates the need of using a trim mask to remove the unwanted printable lines.

SUMMARY OF THE INVENTION

One object of the present invention is to provide a method of fabricating an alternating phase shift mask wherein unwanted printable lines are not printed on a semiconductor wafer during patterning via an optical lithographic process.

A further object of the present invention is to provide a method of fabricating an alternating phase shift mask wherein the use of trim masks to remove unwanted printable lines can be eliminated.

A yet further object of the present invention is to provide a method of fabricating an alternating phase shift mask which employs relatively simple processing steps that eliminate the formation of step regions within the transparent or semi-transparent substrate.

These and other objects and advantages are achieved in the present invention by adding additional processing steps to the phase shift mask manufacturing process so to eliminate the edges of the step regions that cause printing of the undesirable printable lines.

In a first method of the present invention, the elimination of the edges of the step regions can be obtained in the present invention by utilizing the following processing steps which include the steps of:

(a1) forming at least one opaque image on a surface of a substrate;

(b1), forming a hardened, patterned first resist on portions of said substrate including said at least one opaque image, while leaving other portions of said substrate exposed;

(c1) forming a patterned second resist so that at least one edge of said second resist is located in areas susceptible to printable step defects and reflowing said second resist to obtain a sloped profile at said at least one edge;

(d1) transferring said sloped profile of said patterned second resist to said substrate, while maintaining a substantially vertical profile in said substrate beneath said at least one opaque image; and (e1) removing said first and second resists.

Several different embodiments can be used in the first method of the present invention in transferring the sloped profile of the patterned second resist to the substrate. In one embodiment of the present invention, the sloped resist profile is transferred to the substrate utilizing a dry etching process such as plasma etching or laser ablation. In another embodiment of the present invention, the sloped resist profile is transferred to the substrate utilizing a combination of dry etching and ashing. In yet another embodiment of the present invention, step (d1) comprises ion implanting through the second resist into the substrate so as to create an implant profile in the substrate and selectively removing said implant profile utilizing a wet etch process or a laser ablation process such as a femtosecond laser ablation process.

It is noted that the present invention also works in cases wherein the second resist denoted in step (c1) is not utilized. In such an embodiment, a localized implant using a light-absorbing ion such as Ga is employed in creating the sloped profile in the substrate. The sloped profile created in the substrate is then removed utilizing a wet etch process or a laser ablation process such as a femtosecond laser ablation process.

In a second method of the present invention, the elimination of the edges of the step regions can be obtained in the present invention by utilizing the following method which includes the steps of:

(a2) forming at least one opaque image on a surface of a substrate;

(b2) forming a hardened, patterned first resist on portions of said substrate including said at least one opaque image, while leaving other portions of said substrate exposed;

(c2) forming a patterned second resist so that at least one edge of said second resist is located in areas susceptible to printable step defects and implanting a sloped profile into said substrate;

(d2) removing said sloped profile from said substrate, while maintaining a substantially vertical profile in said substrate beneath said at least one opaque image; and (e2) removing said first and second resists.

It is noted that step (d2) of the second method of the present invention, may include a chemical removal process or a laser removal process such as a femtosecond laser ablation process. In the second method of the present invention, it is also possible to omit the use of the second resist in step (c2) and to create the sloped profile in the substrate by utilizing a controlled ion implant process wherein light absorbing ions such as Ga are employed.

DETAILED DESCRIPTION OF THE INVENTION

Figure 1A:
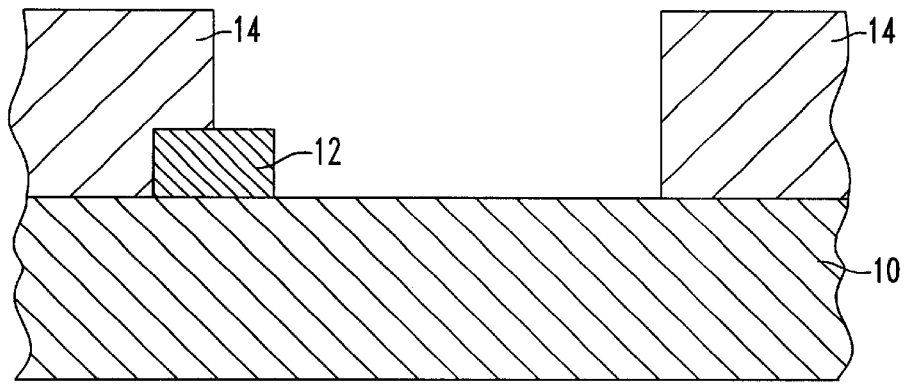
FIGS. 1A–1D are pictorial representations (through cross-sectional views) of a prior art phase shift mask that includes step regions formed in the substrate utilizing conventional processing steps well known in the art.
Figure 1B:
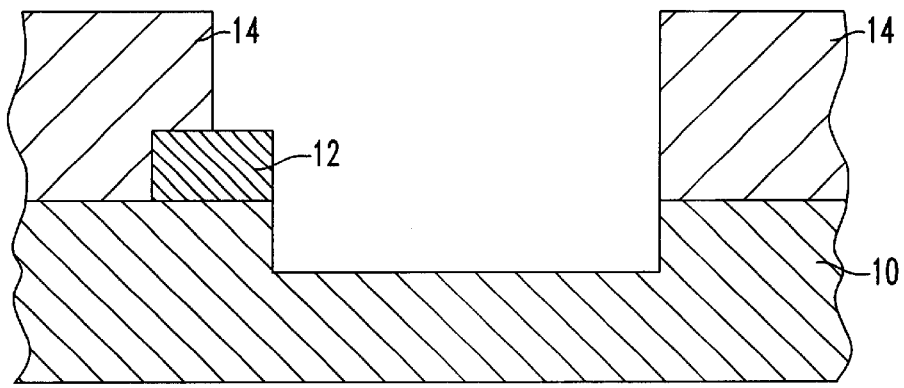
Figure 1C:
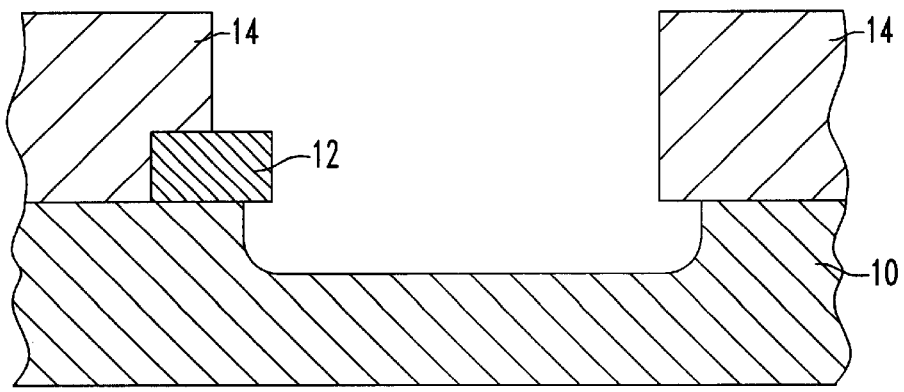
Figure 1D:
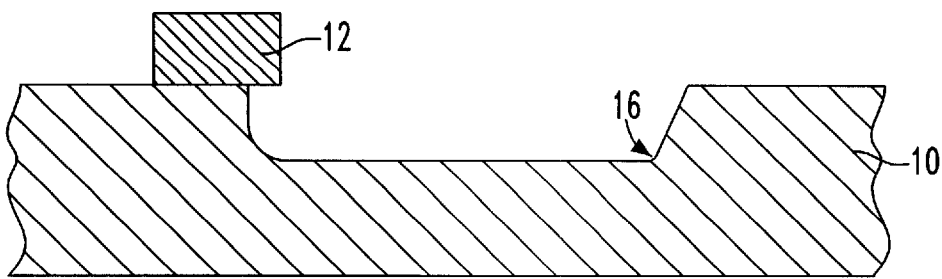

The present invention, which provides various methods of forming an improved alternating phase shift mask that is substantially or totally void of step regions in the substrate, will now be described in more detail by referring to the drawings that accompany the present invention. It is noted that in the accompanying drawings like and/or corresponding elements are referred to by like reference numerals.

Figure 2A:
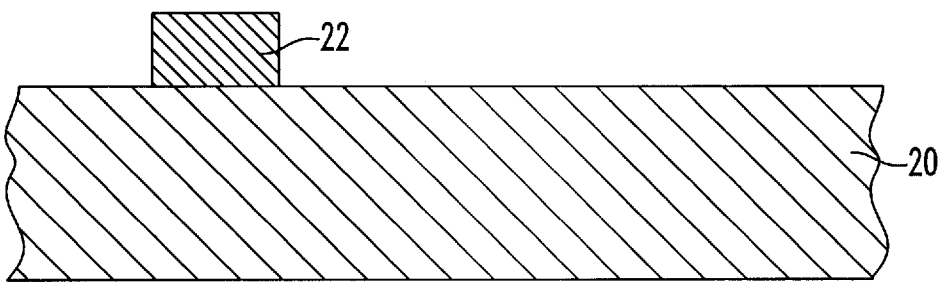
FIGS. 2A–2F are pictorial representations (through cross-sectional views) showing one embodiment of the first method of the present invention wherein plasma etching or laser ablation is employed in transferring the sloped resist profile to the substrate.

Reference is first made to FIGS. 2A–2F which illustrate various processing steps which are employed in the first method of the present invention. Specifically, FIG. 2A shows an initial structure that is employed in the present invention. The initial structure illustrated in FIG. 2A includes substrate 20 having at least one opaque image 22 formed thereon. The illustrated structure is made using conventional processing steps well known in the art and conventional materials are employed in forming the same.

For example, substrate 20 is comprised of any conventional transparent or semi-transparent material that is typically employed as a substrate for a phase shift mask. Illustrative examples of suitable transparent or semi-transparent substrates include, but are not limited to: quartz, glass, calcium fluoride, diamond, diamond-like carbon and the like. A highly preferred transparent or semi-transparent material that is employed in the present invention as substrate 20 is quartz.

The substrate may be used as is, or it can be cleaned prior to use utilizing a cleaning technique that is well known in the art that is effective in removing any possible contaminants from the substrate.

An opaque material which is substantially impervious to radiative energy, i.e., light, is then formed on substrate 20 and the opaque material is thereafter patterned so as to form one or more opaque regions 22 on the substrate (in the drawings only one opaque region is shown). Illustrative examples of suitable opaque materials that can be employed in the present invention in forming opaque regions 22 include, but are not limited to: MoSi, carbon, chrome and multilayers thereof. A highly preferred opaque material employed in the present invention is a material that comprises chrome, such as chrome oxide, chrome fluoride and chrome oxide fluoride.

The opaque material is formed as a layer on the surface of substrate 20 by utilizing any conventional deposition process such as chemical vapor deposition, plasma-assisted CVD, sputtering, evaporation and plating. The thickness of the opaque material is not critical to the present invention, but typically the opaque material has a thickness after deposition of from about 40 to about 400 nm, with a thickness of from about 200 to about 320 nm being more highly preferred.

After applying the layer of opaque material to the substrate, the at least one opaque region 22 is formed by conventional processes including lithography and etching. Specifically, the lithography process employed at this stage of the present invention includes application of a photoresist (not shown in the drawings) to the layer of opaque material; exposing the photoresist to a pattern of radiation, and developing the patterned photoresist utilizing a conventional developer solution. The pattern is then transferred to the layer of opaque material utilizing an etching process that has a high selectivity for removing opaque material as compared to the transparent or semi-transparent substrate. A suitable etching process employed in transferring the pattern to the layer of opaque material is a dry etching process such as reactive-ion etching (RIE) or plasma etching.

After forming opaque region 22 on a portion of substrate 20, a patterned first resist is formed on the structure shown in FIG. 2A so as to provide a structure wherein portions of substrate 20 and opaque region 22 are protected, while other portions of substrate 20 and opaque region 22 are left exposed. The patterned first resist is then hardened providing the structure shown in FIG. 2B. Note that reference numeral 24 denotes the hardened, patterned first resist.

Figure 2B:
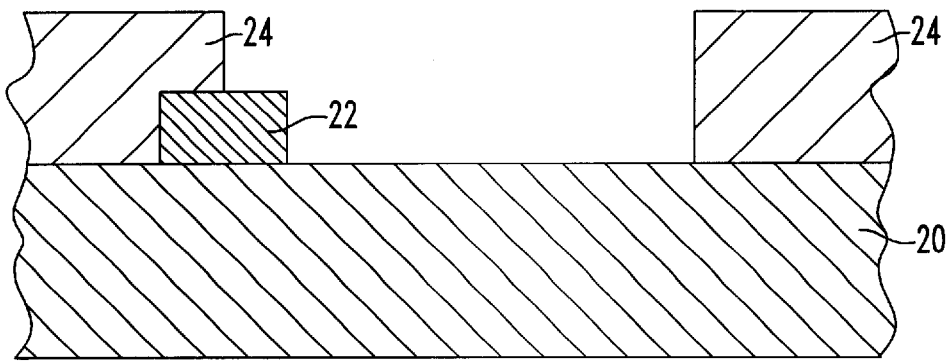

Specifically, the structure shown in FIG. 2B is prepared by first applying a first resist material to the surface of the structure shown in FIG. 2A by utilizing a conventional deposition process such as CVD, sputtering, or spin-on coating. The first resist material is composed of conventional materials that are well known in the art. Following application of the first resist material, the first resist is subjected to a conventional lithography step as defined above.

Next, the patterned first resist is subjected to a hardening process which serves to crosslink the resist into a resist that is more resistant to wet and dry etching processes. Any conventional hardening process including UV exposure and/or heating may be employed in the present invention in forming hardened, patterned first resist 24.

Figure 2C:
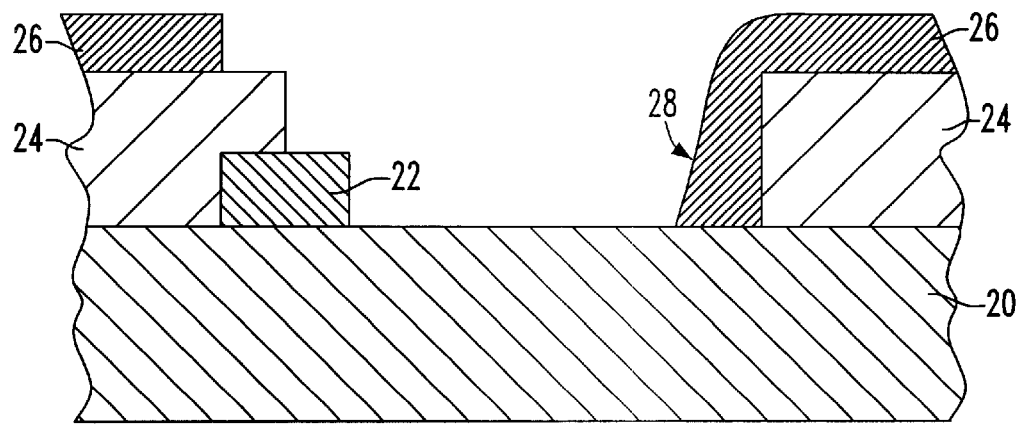

FIG. 2C illustrates the structure that is formed after providing patterned second resist 26 to the structure shown in FIG. 2B. The patterned second resist is formed so that edges 28 of the second resist are located in areas which are susceptible to printable defect steps. Specifically, the patterned second resist (which may be composed of the same or different resist material as the first resist) is formed utilizing a conventional deposition process and lithography, as defined hereinabove for the first resist.

After forming the patterned second resist on the surface of the substrate, the patterned second resist is then subjected to a reflow process in which sloped profile 30 is formed at edges 28. The structure that is formed after second resist reflow is shown, for example, in FIG. 2D. Typically, in the present invention, the second resist is reflowed to obtain a less than 45° angle in the second resist edges. This slope is employed in the present invention in defining the final etched image in the substrate edges. his step of the present invention,. i.e., reflow of patterned second resist 26, is typically carried out in an oven or furnace at a temperature of from about 75° to about 140° C. for a time period of from about 10 to about 40 minutes. More preferably, the reflow step of the present invention is performed at a temperature of from about 90° to about 120° C. for a time period of from about 15 to about 30 minutes. The reflow is typically carried out in a forming gas atmosphere, i.e., nitrogen and helium, or a reducing gas atmosphere such as $H_2$.

Figure 2D:
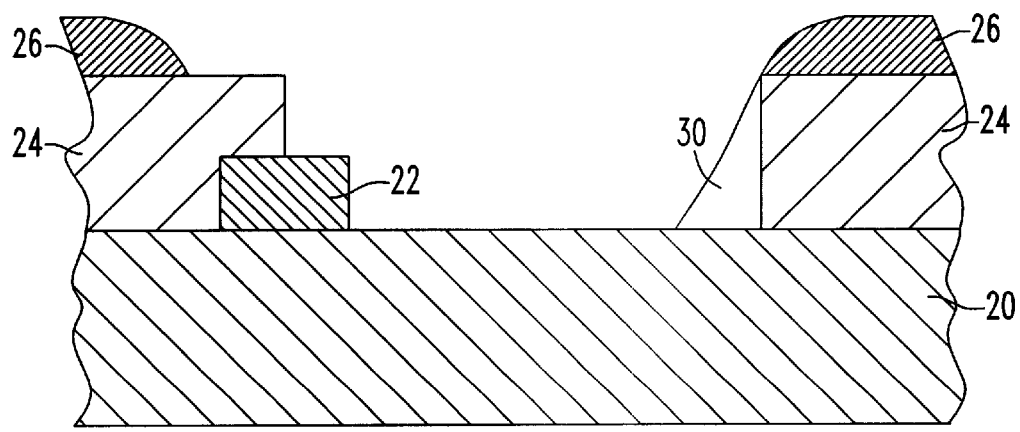

In accordance with the next step of the first method of the present invention, the sloped profile shown in FIG. 2D is then transferred to the substrate, while maintaining a substantially vertical profile in the substrate beneath the at least one opaque image; See FIG. 2E. Several different embodiments can be used in the present invention in transferring the sloped profile of said patterned second resist to the substrate. In one embodiment of the present invention, the sloped resist profile is transferred to the substrate utilizing a dry etching process. In another embodiment of the present invention, the sloped resist profile is transferred to the substrate utilizing a combination of dry etching and ashing. In yet another embodiment of the present invention, step (d1) comprises ion implanting a light absorbing ion through the second resist into the substrate so as to create an implant profile in the substrate and selectively removing said implant profile utilizing a wet etch process or a laser ablation process.

When a dry etching process is employed in the present invention, any conventional dry etching process such as reactive-ion etching, ion-beam etching, plasma etching and laser ablation may be employed. A highly preferred dry etching process employed at this point of the present invention is plasma etching. The plasma etching process that may be employed in the present invention includes the use of any plasma gas or mixtures thereof that has a high capability of removing substrate 20 as compared with opaque region 22 or second resist 26. When the etch rate of the substrate equals the etch rate of the resist, the profile of the second resist mask is replicated in the substrate. If, on the other hand, more or less slope is required, the plasma etching process may be adjusted to etch back the second resist (shallower substrate) or to leave some second resist on the sidewalls (steeper profile).

Although the present invention contemplates the use of all laser ablation techniques, it is highly preferred to use a femtosecond laser ablation process at this point of the present invention. The term "femtosecond laser ablation" is used herein to denote a laser etching process that removes the implant region due to absorption of energy by the implant species. Any non-ion implanted areas within the substrate will not absorb light; therefore light will pass through it. When a femtosecond laser ablation process is employed, the femtosecond laser ablation process is typically carried out using a laser having an energy of from about 5 to about 50 µJ per pulse for less than about 200 femtoseconds. More preferably, the femtosecond laser ablation process is carried out using a laser having an energy of from about 15 to about 30 µJ per pulse for less than about 100 femtoseconds.

It is noted that other femtosecond laser ablation conditions besides those mentioned above can be employed in the present invention.

Figure 3:
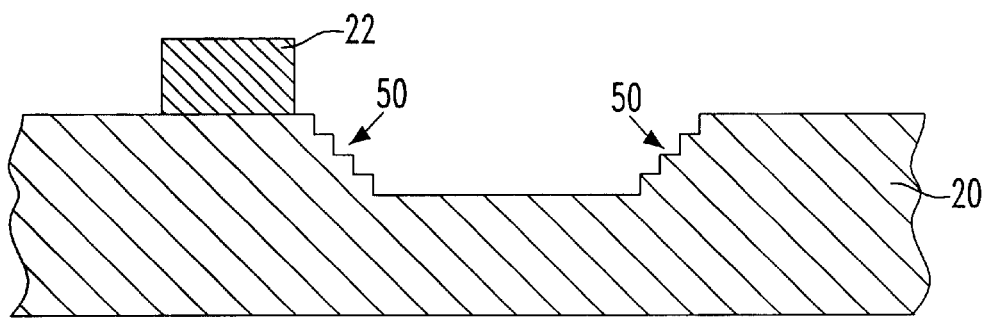
FIG. 3 is a pictorial representation (through a cross-sectional view) showing a phase shift mask that is prepared utilizing the first method of the present invention, wherein combined plasma-etching and ashing is employed.

In yet another embodiment of the present invention, the dry etching step, e.g., plasma etching, may be used in combination with an ashing step so as to create a stair step profile such as shown in FIG. 3. Specifically, in FIG. 3, the stair step profile is labeled as 50. Note that the combined plasma etching and ashing steps form small stair steps that are lower than the resolving capability of the optical tool used during the lithographic process; therefore the small steps are not printed.

When ashing is combined with dry etching, the ashing step is conducted in the same tool as the etching step. Typically, ashing is carried out in an oxidizing ambient such as oxygen, ozone, NO and other like oxygen-containing ambients and the plasma etch species are alternated with the oxidizing species in the same plasma etch tool.

In an additional embodiment of the present invention, the sloped resist profile may be transferred to the substrate by utilizing an ion implantation process wherein a light absorbing ion such as Ga, As, B or Sb is implanted through the second resist into the substrate so as to create an implant profile in the substrate. In the present invention, the ion implantation process is carried out using an ion dose of from about 1E7 $cm^{-2}$ or above, with an ion dose of from about 2E8 to about 4E8 $cm^{-2}$ being more highly preferred. Following the ion implantation process, an etching process such as a wet process or laser ablation (such as a femtosecond laser ablation process) may be employed in removing the implanted region from the substrate. When a wet etch process is employed a chemical etchant such as HF may be used in removing the implant region from the substrate.

Note that in some embodiments of this first method, the second resist is not employed. In such cases, the sloped profile is created in the desired location within the substrate utilizing a controlled ion implantation process wherein one of the above-mentioned light-absorbing ions is employed. The sloped profile created by the controlled ion implantation is then removed utilizing the above mentioned laser ablation process.

Figure 2E:
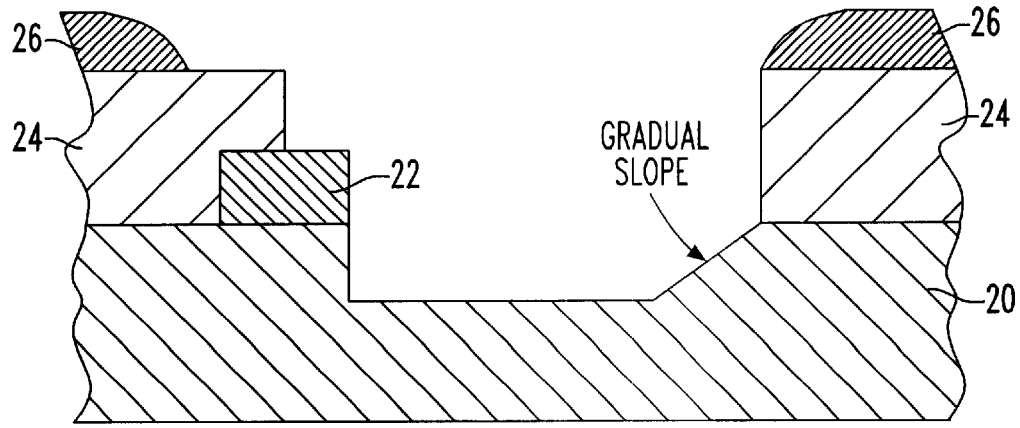
Figure 2F:
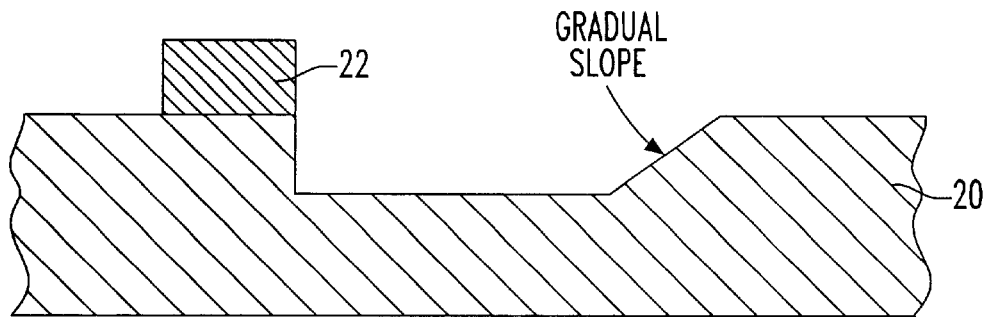

Following the transfer of the sloped resist profile to the substrate, the first and second resists are then removed from the structure illustrated in FIG. 2E utilizing one or more conventional stripping processes well known in the art. The structure that is formed after resist removal is shown in FIG. 2F. Note that in some embodiments of the present invention, the hardened first resist may remain on the structure and the substrate may be further etched using a conventional etch back process. The etch back process is typically employed when a plasma etching process is employed in the preceding step. In a preferred embodiment, the etch back step is carried out with HF in order to help normalize the transmission through the etched substrate. When such an embodiment is employed, it typically occurs prior to stripping of the first resist.

The above description which makes reference to FIGS. 2A–2F illustrates a first method that is provided by the present invention. The following description, which makes reference to FIGS. 4A–4F, illustrates the second method of the present invention.

Figure 4A:
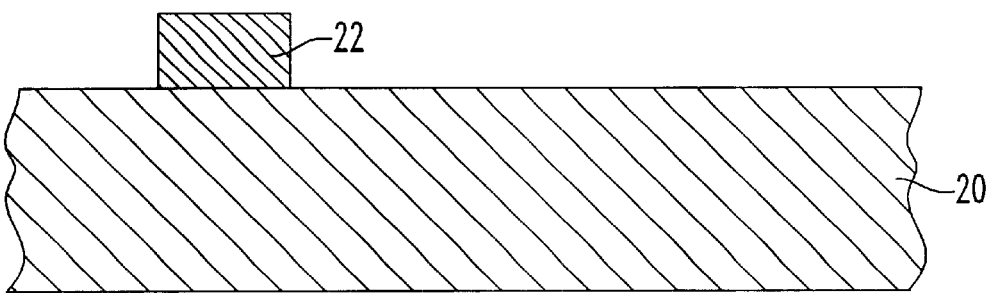
FIGS. 4A–4F are pictorial representations (through cross-sectional views) showing the inventive phase shift mask during various processing steps of the second method of the present invention.

The second method of the present invention begins with forming the initial structure shown in FIG. 4A. Note that the structure shown in FIG. 4A is identical to that shown in FIG. 2A; therefore no further elaboration is needed.

Figure 4B:
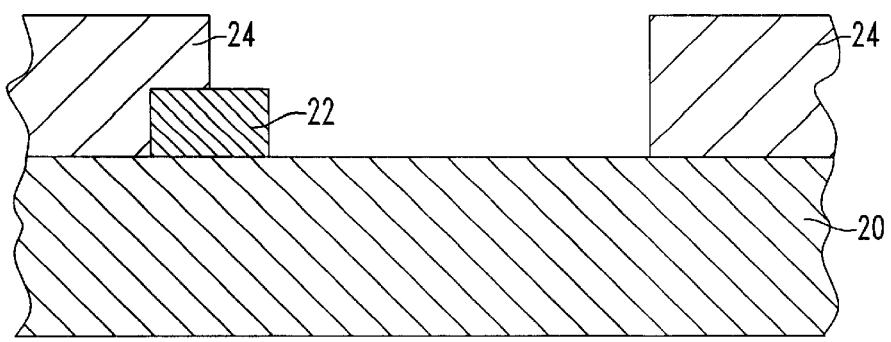

Next, as shown in FIG. 4B, hardened, patterned first resist 24 is formed on portions of substrate 20 and opaque regions 22 utilizing the same processing steps employed in forming the structure shown in FIG. 2B.

Figure 4C:
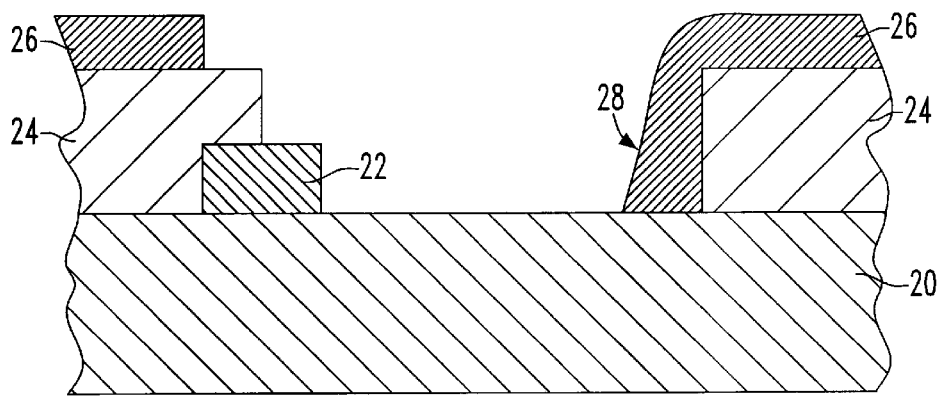

FIG. 4C shows the structure formed after patterned second resist 26 is formed on the structure shown in FIG. 4B. Note that in FIG. 4B patterned second resist 26 contains at least one edge that is located in areas that are susceptible to printable step defects.

Figure 4D:
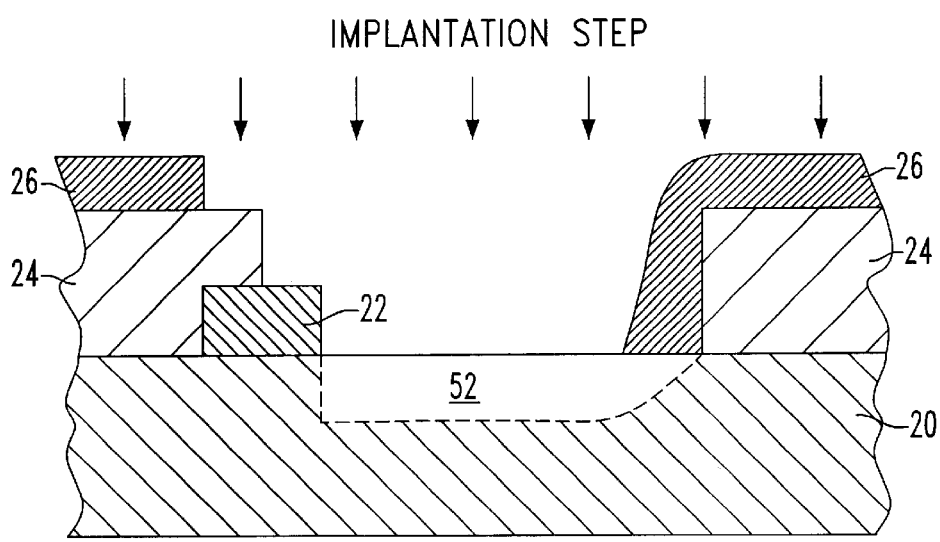

FIG. 4D shows the structure that is formed after implanting a sloped profile into said substrate. The implanted sloped profile is denoted as 52 in the drawings. This ion implantation process includes the uses of the same ions and doses as mentioned previously herein. In order to obtain a sloped profile in the substrate, a masked ion implantation process is typically employed. It is also contemplated to employ a direct implant of a light absorbing species such as Ga into the substrate without the use of the second resist.

Figure 4E:
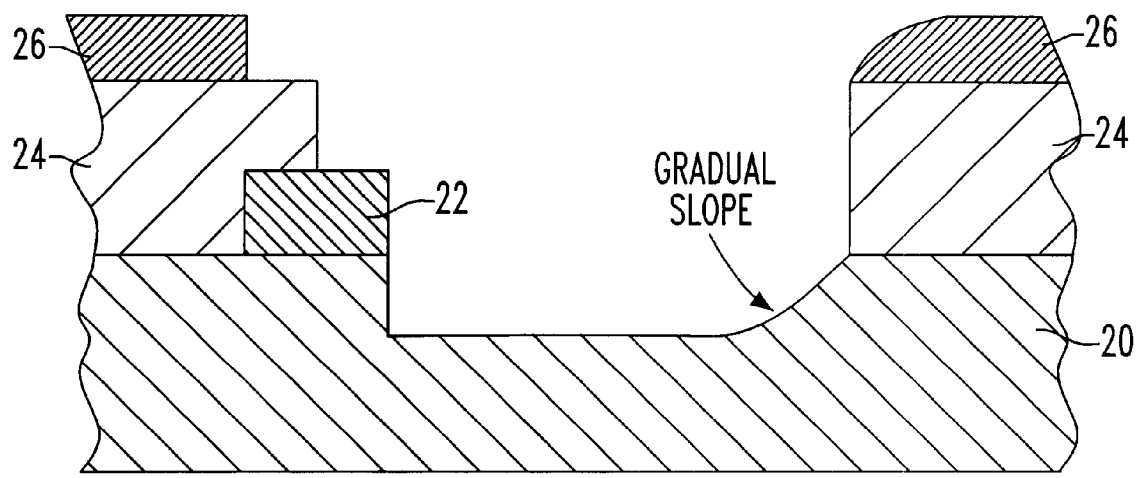

FIG. 4E shows the structure that is obtained after the sloped profile is removed from the substrate utilizing a conventional wet etch process or laser ablation. When a wet etch is employed, a chemical etchant such as HF that has a high selectivity for removing the implant region from the substrate, while maintaining a substantially vertical profile in the substrate beneath the at least one opaque image. The laser ablation process includes the femtosecond laser ablation process mentioned above as well as other laser etching processes that are capable of selectively removing the implant region from the substrate.

Figure 4F:
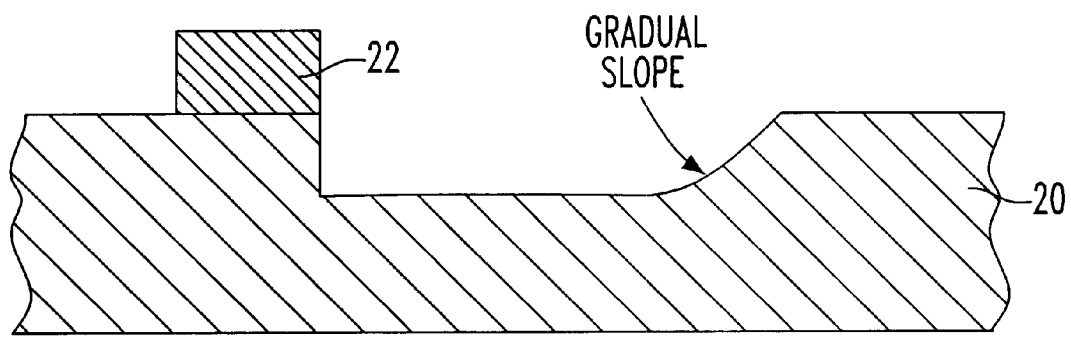

FIG. 4F shows the structure, e.g., mask, that is obtained after the first and second resists have been removed from the structure utilizing one or more conventional stripping processes well known in the art.

Notwithstanding which of the methods is employed in the present invention, the resultant mask (See, for example, FIGS. 2F and 4F) contains a gradual slope in the substrate which is formed opposite to that of the opaque image region. This gradual slope takes the place of the vertical substrate step of the prior art that causes a phase step and a printable line on the wafers. By utilizing the methods of the present invention, the use of employing a second trim mask for removing the printable lines can be eliminated. This allows for extra capacity in the device line stepper tools and for control of quality of the mask. Eliminating a second pass of stepper time for all wafers and for all levels of alternating masks is a significant cost advantage.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method for providing an alternating phase shift mask comprising the steps of:

(a1) forming at least one opaque image on a surface of a substrate;

(b1) forming a hardened, patterned first resist on portions of said substrate including said at least one opaque image, while leaving other portions of said substrate exposed;

(c1) forming a patterned second resist so that at least one edge of said second resist is located in areas susceptible to printable step defects and reflowing said second resist to obtain a sloped profile at said at least one edge;

(d1) transferring said sloped profile of said patterned second resist to said substrate, while maintaining a substantially vertical profile in said substrate beneath said at least one opaque image; and (e1) removing said first and second resists.

2. The method of claim 1 wherein said substrate is transparent or semi-transparent.

3. The method of claim 1 wherein said substrate is comprised of quartz, glass, calcium fluoride, diamond, or diamond-like carbon.

4. The method of claim 3 wherein said substrate is comprised of quartz.

5. The method of claim 1 wherein said at least one opaque image is comprised of MoSi, carbon, chrome or multilayers thereof.

6. The method of claim 1 wherein said at least one opaque image is comprised of chrome oxide, chrome fluoride or chrome oxide fluoride.

7. The method of claim 1 wherein step (a1) comprises the steps of lithography and etching.

8. The method of claim 1 wherein step (b1) comprises the steps of lithography, etching, and crosslinking.

9. The method of claim 8 wherein said cross-linking includes UV exposure, heating, or a combination of UV exposure and heating.

10. The method of claim 1 wherein step (c1) comprises the steps of lithography and etching.

11. The method of claim 1 wherein said reflowing is performed at a temperature of from about 70° to about 140° C. for a time period of from about 10 to about 40 minutes.

12. The method of claim 11 wherein said reflowing is performed at a temperature of from about 90° to about 120° C. for a time period of from about 15 to about 30 minutes.

13. The method of claim 1 wherein said reflowing is performed in a forming gas atmosphere or a reducing gas.

14. The method of claim 1 wherein said sloped profile has a less than 45° angle between said at least one edge and a surface of said substrate.

15. The method of claim 1 wherein said (d1) comprises a dry etching process selected from the group consisting of reactive-ion etching, plasma etching, ion beam etching, and laser ablation.

16. The method of claim 15 wherein said dry etching process is performed by plasma etching or laser ablation.

17. The method of claim 16 wherein said laser ablation comprises a femtosecond laser ablation process.

18. The method of claim 1 wherein said patterned second resist is not employed and said sloped profile is formed in said substrate using a controlled ion implantation process wherein a light absorbing ion is employed.

19. The method of claim 1 wherein step (d1) includes a combination of plasma etching and ashing.

20. The method of claim 19 wherein said ashing is carried out in an oxidizing ambient.

21. The method of claim 1 wherein step (d1) comprises a combination of ion implantation and etching.

22. The method of claim 21 wherein said ion implantation includes a light absorbing ion selected from the group consisting of Ga, As, B and Sb.

23. The method of claim 21 wherein said ion implantation is carried out at an ion dose of about 1E7 cm$^{-2}$ or greater.

24. The method of claim 23 wherein said ion implantation is carried out at an ion dose of from about 2E8 to about 4E8 cm$^{-2}$.

25. The method of claim 21 wherein said etching includes a wet etch process or laser ablation.

26. The method of claim 25 wherein said laser ablation comprises a femtosecond laser ablation process.

27. The method of claim 26 wherein said femtosecond laser ablation process is carried using a laser having an energy of from about 5 to about 50 $\mu$J per pulse for less than about 200 femtoseconds.

28. The method of claim 27 wherein said femtosecond laser ablation process is carried out using a laser having an energy of from about 15 to about 30 $\mu$J per pulse for less than about 100 femtoseconds.

29. The method of claim 1 further comprising the step of performing an etch back step after removing said second resist, but prior to removing said first resist.

30. A method of forming an alternating phase shift mask comprising the steps of:
(a2) forming at least one opaque image on a surface of a substrate;
(b2) forming a hardened, patterned first resist on portions of said substrate including said at least one opaque image, while leaving other portions of said substrate exposed;
(c2) forming a patterned second resist so that at least one edge of said second resist is located in areas susceptible to printable step defects and implanting a sloped profile into said substrate;
(d2) removing said sloped profile from said substrate, while maintaining a substantially vertical profile in said substrate beneath said at least one opaque image; and
(e2) removing said first and second resists.

31. The method of claim 30 wherein said substrate is transparent or semi-transparent.

32. The method of claim 30 wherein said substrate is comprised of quartz, glass, calcium fluoride, diamond, or diamond-like carbon.

33. The method of claim 32 wherein said substrate is comprised of quartz.

34. The method of claim 30 wherein said at least one opaque image is comprised of MoSi, carbon, chrome or multilayers thereof.

35. The method of claim 30 wherein said at least one opaque image is comprised of chrome oxide, chrome fluoride or chrome oxide fluoride.

36. The method of claim 30 wherein step (a2) comprises the steps of lithography and etching.

37. The method of claim 30 wherein step (b2) comprises the steps of lithography, etching, and crosslinking.

38. The method of claim 37 wherein said cross-linking includes UV exposure, heating, or a combination of UV exposure and heating.

39. The method of claim 30 wherein step (c2) comprises the steps of lithography and etching.

40. The method of claim 30 wherein step (d2) comprises a combination of ion implantation and etching.

41. The method of claim 40 wherein said ion implantation includes a light absorbing ion selected from the group consisting of Ga, As, B and Sb.

42. The method of claim 40 wherein said ion implantation is carried out at an ion dose of about 1E7 cm$^{-2}$ or greater.

43. The method of claim 42 wherein said ion implantation is carried out at an ion dose of from about 2E8 to about 4E8 cm$^{-2}$.

44. The method of claim 40 wherein said etching includes a wet etch process or laser ablation.

45. The method of claim 44 wherein said laser ablation comprises a femtosecond laser ablation process.

46. The method of claim 45 wherein said femtosecond laser ablation process is carried out using a laser having an energy of from about 5 to about 50 $\mu$J per pulse for less than about 200 femtoseconds.

47. The method of claim 46 wherein said femtosecond laser ablation process is carried out using a laser having an energy of from about 15 to about 30 $\mu$J per pulse for less than about 100 femtoseconds.

48. The method of claim 30 further comprising the step of performing an etch back step after removing said second resist, but prior to removing said first resist.

49. The method of claim 30 wherein said second resist is omitted and said sloped profile is formed in the substrate utilizing a controllable ion implantation process wherein a light absorbing ion is implanted into said substrate.

* * * * *